United States Patent [19]

Nakamura

[11] Patent Number: 4,936,964
[45] Date of Patent: Jun. 26, 1990

[54] PROCESS FOR PRODUCING FILM COATED WITH TRANSPARENT CONDUCTIVE METAL OXIDE THIN FILM

[75] Inventor: Kenji Nakamura, Takatsuki, Japan

[73] Assignee: Sumitomo Bakelite Company Limited, Tokyo, Japan

[21] Appl. No.: 293,680

[22] Filed: Jan. 5, 1989

[30] Foreign Application Priority Data

Jan. 9, 1988 [JP] Japan .................................. 63-1817

[51] Int. Cl.$^5$ .............................................. C23C 14/54
[52] U.S. Cl. ......................... 204/192.13; 204/192.29; 204/298.03
[58] Field of Search ...................... 204/192.13, 192.29, 204/298 MT

[56] References Cited

U.S. PATENT DOCUMENTS

| 4,166,783 | 9/1979 | Turner | 204/192.13 |
| 4,336,119 | 6/1982 | Gillery | 204/192.13 |
| 4,407,709 | 10/1983 | Enjouji et al. | 204/192.13 |
| 4,661,229 | 4/1987 | Hemming et al. | 204/192.13 |

FOREIGN PATENT DOCUMENTS

| 62-15633 | 4/1987 | Japan | 204/298 |
| 62-211378 | 9/1987 | Japan | 204/298 |
| 63-202806 | 8/1988 | Japan | 204/192.29 |

*Primary Examiner*—Aaron Weisstuch
*Attorney, Agent, or Firm*—Browdy and Neimark

[57] ABSTRACT

A substrate film coated with a transparent conductive metal oxide thin film which has uniform light transmittance, uniform sheet resistance and uniform adhesion can be semi-continuously produced by (a) using a semi-continuous roll-to-roll sputtering apparatus for supplying a transparent substrate film to be coated and which comprises a plasma emission spectroanalysis system, a system for measuring the light transmittance and sheet resistance of the resulting transparent conductive film and a system for feeding the measurement results of the above two systems to a controller for controlling the rate of oxygen feed or the discharge current or power, (b) measuring the light transmittance and sheet resistance of the transparent conductive film produced as well as the atomic spectral intensities of the target component(s) and argon present in the vicinity of the target surface, and (c) controlling the rate of oxygen feed or the discharge power or current so that the measured atomic spectral intensities of the target component(s) and argon or their computation results may be kept constant and further simultaneously controlling the anode current so that the atomic spectral intensity of argon is kept in a given range, in order to maintain the light transmittance and sheet resistance of the resultant film within their respective predetermined ranges and to provide good adhesion between the substrate film and the thin film.

4 Claims, 2 Drawing Sheets

PROCESS FOR PRODUCING FILM COATED WITH TRANSPARENT CONDUCTIVE METAL OXIDE THIN FILM

FIELD OF THE INVENTION

The present invention relates to a process for producing a film coated with a transparent conductive metal oxide thin film which has a uniform light transmittance, a uniform sheet resistance and a uniform adhesion.

BACKGROUND OF THE INVENTION

The conventional process for producing a film coated with a metal oxide thin film, using an apparatus which enables semi-continuous roll-to-roll metal oxide deposition on a ribbon-shaped film by reactive sputtering is characterized by being able to easily obtain a film having a metal oxide thin film of large area and accordingly is industrially very effective. In the process, however, the surface condition of the target changes with time even when the cathode current, the anode current, the temperature of the film feed, the rate of oxygen feed and the rate of argon feed are kept constant. As a result, there occurs a fluctuation of deposition rate and oxidation degree of metal to be adhere to a film, i.e., fluctuation of the light transmittance, adhesion (adhesion between a substrate film and a metal oxide thin film) and sheet resistance of the film produced. Hence, it becomes necessary to always control the cathode current, the anode current or the rate of oxygen feed in order to make the light transmittance, adhesion and sheet resistance of the film constant. However, it has been difficult to always keep, during thin film formation, the rate of oxygen feed or the cathode current and the anode current at their respective optimum levels in order to make constant, in a highly precise manner, the deposition rate and the oxidation degree of a metal oxide to be adhered to a film and thereby to obtain a continuous ribbon-shaped film having uniform light transmittance, uniform sheet resistance and uniform adhesion.

OBJECT OF THE INVENTION

The object of the present invention is to obtain a film coated with a metal oxide thin film which has uniform light transmittance, uniform sheet resistance and uniform adhesion, by the use of a sputtering apparatus of a semi-continuous operation type. In order to achieve the above object, the present inventors conducted research on the automatic control of the rate of oxygen feed in place of the conventional manual control to provide a constant current flow through a target. As a result, the present inventors found that a film coated with a transparent conductive metal oxide thin film which has uniform light transmittance, uniform sheet resistance and uniform adhesion, can be easily produced by using a method of controlling the rate of oxygen feed or the cathode current or the cathode power so that the measured atomic spectral intensities of the target component and argon, both present in the plasma generated near the target during film formation, or their computation results may be kept constant and further by controlling the anode current so that the atomic spectral intensity of argon may be kept in a given range.

SUMMARY OF THE INVENTION

The present invention provides a process for semi-continuously producing a film coated with a transparent conductive metal oxide thin film which has uniform light transmittance, uniform sheet resistance and uniform adhesion, which process comprises (a) using a semi-continuous roll-to-roll sputtering apparatus for supplying a transparent substrate film to be coated and which comprises a plasma emission spectroanalysis system, a system for measuring the light transmittance and sheet resistance of the resulting transparent conductive film and a system for feeding the measurement data of the above two systems to a controller for controlling the rate of oxygen feed or the discharge current or power, (b) measuring the light transmittance and sheet resistance of the film produced as well as the atomic spectral intensities of the target component(s) and argon present in the vicinity of the target surface, and (c) controlling the rate of oxygen feed or the discharge power or current so that the measured atomic spectral intensities of the target component(s) and argon or their computation results may be kept constant, and further simultaneously controlling the anode current so that the atomic spectral intensity of argon may be kept in a given range, in order to keep the light transmittance and sheet resistance of the resultant film within their respective predetermined ranges.

DETAILED DESCRIPTION OF THE EMBODIMENTS

Figure 1:
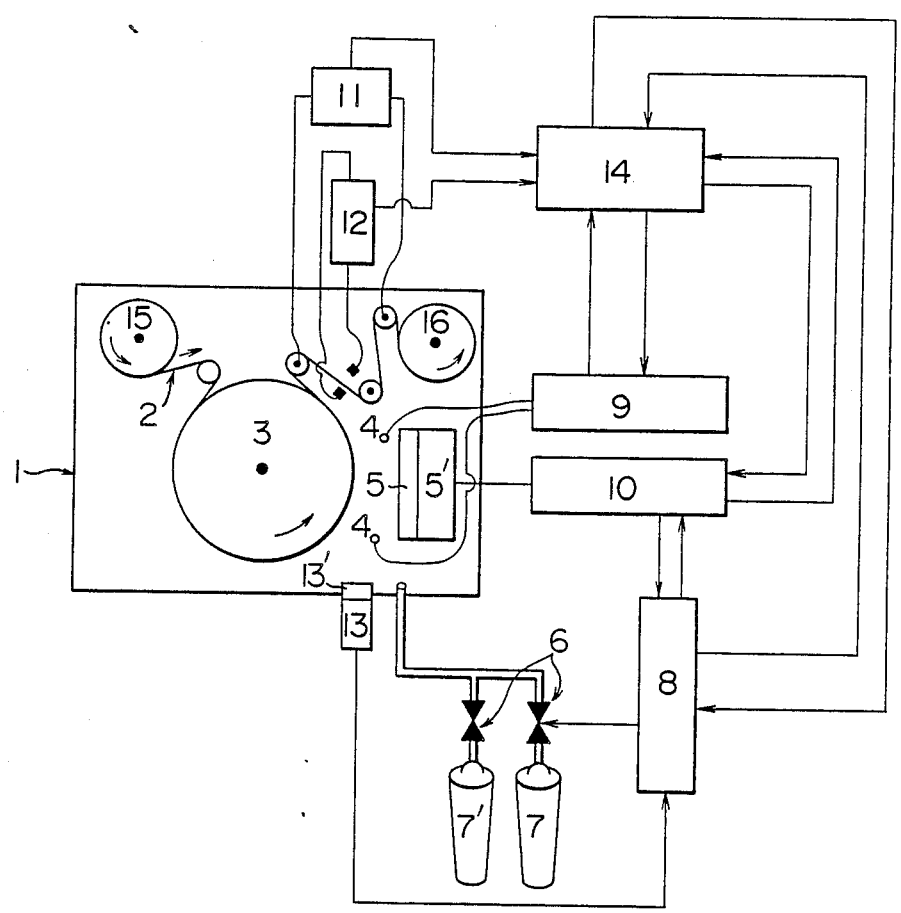
FIG. 1 is a schematic diagram showing an apparatus for semi-continuously producing a film coated with ITO (indium tin oxide) which is used in the present invention.

The meanings of the reference numbers in FIG. 1 are as follows: 1: closed vessel, 2: film, 3: film temperature-controlling drum, 4: anode, 5: target, 5, cathode, 6: massflow controller, 7: $O_2$ tank, 7': Ar tank, 8: computation unit, 9: anode power source, 10: cathode power source, 11: resistance meter, 12: light transmittance source, 13: plasma monitor, 13': window, 14: digital computer, 15: feed roll, and 16: wind-up roll.

The present invention relates to a process for semi-continuously forming a metal oxide thin film on a substrate film so that the resulting film has uniform light transmittance, uniform sheet resistance and uniform adhesion between the substrate film and the metal oxide thin film. Hereinafter the present invention is explained in more detail referring to the accompanying drawings. The present invention concerns a process for producing a film coated with a transparent conductive metal oxide thin film which has uniform light transmittance, uniform sheet resistance and uniform adhesion, by (a) using a sputtering apparatus comprising a closed vessel 1 having an exhaust system capable of maintaining a vacuum of $10^{-5}$–$10^{-7}$ Torr, a feed roll 15 for a film 2, a film wind-up roll 16, a roll 3 for controlling the film temperature during thin film formation, a metal plate (the so-called target) 5 which provides a material for the thin film, a magnet for applying a magnetic field to the surface of the target, a cathode power source 10 for sputtering, an anode 4 for promoting the oxidation of the sputtered target component at the time of thin film formation, massflow controllers 6 for feeding oxygen and argon into the closed vessel 1, and a plasma monitor 13 for measuring the atomic spectral intensities of argon and indium at the target surface, as well as a light transmittance meter 12 and a resistance meter 11 both for measuring the properties of the resultant film before winding up, (b) measuring, during the process, the light transmittance and sheet resistance of the resultant film between the film temperature-controlling roll 3 and the wind-up roll 16, as well as the atomic spectral intensities of the target component and argon both at the target surface, and (c) controlling, during the process, the rate of oxygen feed or the cathode current as well as the anode current so that the measurement data of the atomic spectral intensities of the target component and argon or their computation results are kept constant in order to keep the light transmittance and sheet resistance of the resultant film in their desired respective predetermined ranges.

As the substrate film, there are used films of polyether sulfone (PES), polyethylene terephthalate (PET), polyimide (PI), polyether imide (PEI), polycarbonate (PC), and the like.

As the target component, there can be cited In, Sn, indium-tin alloy, Si, Ti, Cd, Zn, and the like.

Typical reactive sputtering is started by the impact of excited and positively ionized argon applied onto the surface of a target; the impact sputters the target component(s); the sputtered component(s) react(s) with oxygen feed together with said argon; and the reaction product deposits on the substrate material to be coated. In the course of sputtering, the target is exposed to oxygen and is oxidized thereby; and, as a result, the surface condition of the target changes with time. Consequently, the rate of deposition and the quality of the thin film formed by deposition changes with time even if the rate of oxygen feed is kept constant.

The anode current has a correlation to the energy of argon ions which impinge on the target surface. Naturally, the anode current greatly affects the energy of the sputtered target component(s) and the residual stress of the component(s) after deposition, i.e., the adhesion of the deposited component(s) to the substrate film, and therefore it is preferable that the anode current be kept low. However, as the anode current is lowered, the light transmittance of the resulting film decreases and the sheet resistance of the film increases. Hence, it becomes necessary to control the rate of oxygen feed and the anode current. Plasma is generated during the thin film formation process of sputtering. The atomic spectral intensities of the target component(s) and argon present in the plasma correspond to the respective amounts present in the plasma.

The proportion of the amount of the target component(s) to the amount of argon indicates the surface condition of the target. For example, the introduction of a large amount of oxygen increases the oxidation of the target surface and reduces the sputtering rate of the target component(s). As a result, the proportion of the target component relative to the amount of argon decreases. Thus, the oxidation degree of the target surface corresponds to the amount of the target component present in the plasma.

The light transmittance and sheet resistance of the film produced are determined by the thickness of the thin film and the oxidation degree of the metal oxide to be deposited, if the surface condition of the substrate film is constant. Therefore, it is possible to make the light transmittance and sheet resistance of the resultant film uniform by controlling the rate of oxygen feed to make the measured atomic spectral intensities of the target component and argon or their computation results constant. It is also possible to form on a substrate film a metal oxide thin film having a constant adhesion to the substrate film, by controlling the anode current so that the atomic spectral intensity of argon may be kept in a given range.

The use of the above method in a reactive sputtering apparatus for semi-continuous production of a film coated with a metal oxide thin film makes it possible to continuously track the correlation of the atomic spectra of the target component(s) and argon, the light transmittance and sheet resistant of the resulting film and the anode current during the formation of a metal oxide thin film, and thereby to control the light transmittance, sheet resistance and adhesion of the resulting film with higher precision.

As a preferred example of the present process, there can be mentioned the production of a film coated with ITO (indium tin oxide).

In the conventional production of such a film, it was necessary to always control the rate of oxygen feed by a skilled operator in order to keep the resistance fluctuation of the resultant film at $\pm 15\%$ in the longitudinal direction and at $\pm 10\%$ in the transverse direction, and computerized automation using measurement data of sheet resistance and light transmittance was impossible. Control of adhesion was also impossible.

Figure 2:
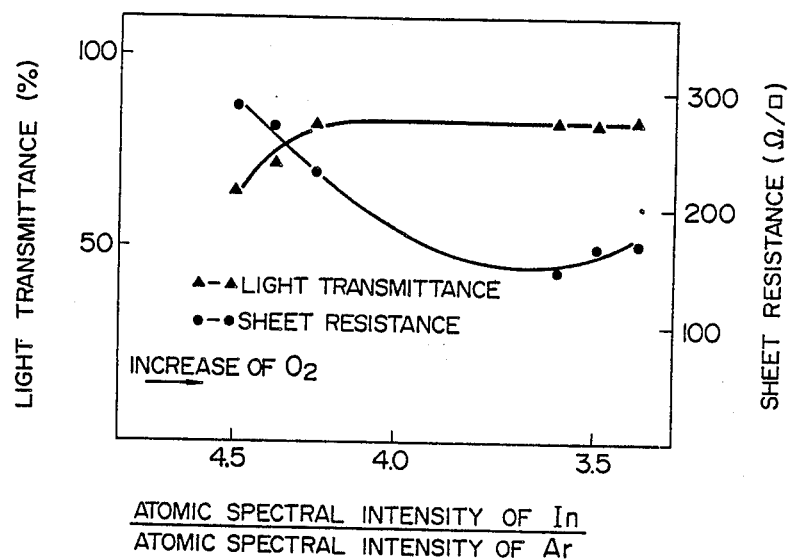
FIG. 2 is a graph showing the relationship between (a) the ratio of the atomic spectral intensity of indium to that of argon and (b) the sheet resistance or light transmittance of the objective film, when the rate of oxygen was changed during the process of the present invention.

According to the present invention, by combining a plasma monitor system, a system for measurement of light transmittance and sheet resistance and a feed-back system in the thin film deposition process, it is possible to attain an indium- to-argon ratio giving the lowest sheet resistance and the highest light transmittance in FIG. 2 at a precision of 5% and also to keep the resistance fluctuation of the resulting film at $\pm 5\%$ in the longitudinal direction and at $\pm 5\%$ in the transverse direction. Further, by keeping the fluctuation of atomic spectral intensity (in terms of absolute value) of argon at 5%, it is possible to form a metal oxide thin film having a substantially uniform adhesion to the substrate film. Furthermore, the "in situ" observation of the generated plasma makes it possible to counter even sudden changes of the thin film deposition conditions caused by degassing from the film and thereby to prevent the formation of inferior products.

Example - Production of ITO coated film

An apparatus as shown in FIG. 1 was used for formation of the film. The vacuum in the closed vessel 1 was controlled at $10^{-5}$–$10^{-7}$ Torr; the film 2 was run at a constant speed of 0.1-3.0 m/min; the film temperature-controlling drum 3 was set at 50°-200° C.; argon was introduced into the closed vessel 1 until the vacuum therein became $10^{-4}$–$10^{-2}$ Torr; a voltage was applied to the target 5 so that the current density at the target area became 20-30 A/m$^2$; and oxygen was introduced into the closed vessel 1 from the oxygen tank 7 at a rate of 4/5 to 5/6 of the rate which was believed to be optimum according to experience. Then, the rate of oxygen feed was changed by the massflow controller 6, and there was obtained the relationships between (a) sheet resistance or light transmittance and (b) ratio of atomic spectral intensity of indium to that of argon, as shown in FIG. 2.

By feeding the value of the optimum ratio of atomic spectral intensity of indium to that of argon obtained by the computation unit 8 to the massflow controller 6 for oxygen so as to keep the ratio constant, the fluctuation of the resistance of the resultant film could be reduced to 5%, as compared with the fluctuations of ±15% in the longitudinal direction and ±10% in the transverse direction of the film produced by the conventional process using manual control of oxygen. Further, the control of the anode current based on the relationship between adhesion and atomic spectral intensity of argon could reduce the fluctuation of adhesion to half of that in the conventional process.

It is to be noted that the relationship in FIG. 2 may show a minute change with time, and therefore, when a film of strict uniformity is desired, it is necessary to always obtain the exact desired relationship between (a) sheet resistance or light transmittance and (b) ratio of atomic spectral intensity of indium to that of argon. In this case, it becomes necessary to change the optimum ratio of atomic spectral intensity of indium to that of argon in accordance with the change of the relationship in FIG. 2. The apparatus used in the present invention has made it possible to obtain the minute change of the relationship in FIG. 2 immediately after the start of thin film deposition and to make a tracking correction for the optimum ratio of atomic spectral intensity of indium to that of argon by using a computer.

What is claimed is:

1. A process for semi-continuously producing a film coated with a transparent conductive metal oxide thin film which has uniform light transmittance, uniform sheet resistance and uniform adhesion, which process comprises:
   (a) using a semi-continuous roll-to-roll sputtering apparatus for supplying a transparent substrate film to be coated and which comprises a plasma emission spectroanalysis system, a system for measuring the light transmittance and sheet resistance of the resulting transparent conductive film and a system for feeding the measurement data of the above two systems to a controller for controlling the rate of oxygen feed or the discharge current or power,
   (b) measuring the light transmittance and sheet resistance of the film produced as well as the atomic spectral intensities of the target component and argon present in the vicinity of the target surface, and
   (c) controlling the rate of oxygen feed or the discharge power or current so that the measured atomic spectral intensities of the target component and argon or their computation results may be kept constant and further simultaneously controlling the anode current so that the atomic spectral intensity of argon is kept in a given range, in order to maintain the light transmittance and sheet resistance of the resultant film within their respective predetermined ranges and to provide good adhesion between the substrate film and the thin film coating.

2. A process according to claim 1, wherein the substrate film is a film of polyether sulfone (PES), polyethylene terephthalate (PET), polyimide (PI), polyether inside (PEI), or polycarbonate (PC).

3. A process according to claim 2, wherein the target is In, Sn, indium-tin alloy, Si, Ti, Cd, ox Zn.

4. A process according to claim 1, wherein the target is In, Sn, indium-tin alloy, Si, Ti, Cd, or Zn.

* * * * *